(12) United States Patent
Lee et al.

(10) Patent No.: US 9,171,643 B2
(45) Date of Patent: *Oct. 27, 2015

(54) SOLID STATE DRIVE TESTER

(71) Applicant: UNITEST INC, Yongin-si, Gyeonggi-do (KR)

(72) Inventors: Eui Won Lee, Seongnam-si (KR); Hyo Jin Oh, Yongin-si (KR)

(73) Assignee: UNITEST INC, Yongin, Gyeonggi-Do (KR)

( * ) Notice: Subject to any disclaimer, the term of this patent is extended or adjusted under 35 U.S.C. 154(b) by 252 days.

This patent is subject to a terminal disclaimer.

(21) Appl. No.: 13/921,701

(22) Filed: Jun. 19, 2013

(65) Prior Publication Data

US 2014/0047286 A1    Feb. 13, 2014

(30) Foreign Application Priority Data

Aug. 13, 2012 (KR) .................. 10-2012-0088333

(51) Int. Cl.
  *G11C 29/00* (2006.01)
  *G11C 29/10* (2006.01)
  *G06F 11/22* (2006.01)
  *G11C 29/56* (2006.01)
  *G11C 29/04* (2006.01)

(52) U.S. Cl.
  CPC ............ *G11C 29/10* (2013.01); *G06F 11/2221* (2013.01); *G11C 29/56008* (2013.01); *G11C 2029/0401* (2013.01); *G11C 2029/5602* (2013.01); *G11C 2029/5606* (2013.01)

(58) Field of Classification Search
  CPC ................ G11C 2029/5602; G11C 2029/5606
  USPC ........................................................ 714/719
  See application file for complete search history.

(56) References Cited

U.S. PATENT DOCUMENTS

| | | | | |
|---|---|---|---|---|
| 5,280,486 A * | 1/1994 | Arkin et al. | ...................... | 714/45 |
| 6,107,818 A * | 8/2000 | Czamara | .................. | 324/762.01 |
| 6,393,591 B1 * | 5/2002 | Jenkins et al. | ................ | 714/725 |
| 6,449,741 B1 * | 9/2002 | Organ et al. | ................... | 714/724 |
| 6,634,005 B1 * | 10/2003 | Lindsay et al. | ............... | 714/726 |
| 7,071,679 B1 * | 7/2006 | Sabih et al. | ................ | 324/750.3 |
| 7,392,446 B1 * | 6/2008 | Simmons et al. | ............ | 714/725 |
| 7,420,384 B1 * | 9/2008 | Sabih et al. | ................ | 324/750.3 |
| 8,467,735 B2 * | 6/2013 | Giles et al. | ................. | 455/67.11 |
| 2004/0030970 A1 * | 2/2004 | Chen et al. | .................... | 714/718 |

(Continued)

FOREIGN PATENT DOCUMENTS

| KR | 10-2008-0039605 A | 5/2008 |
|---|---|---|
| KR | 10-2010-0114697 A | 10/2010 |

*Primary Examiner* — Joseph D Torres
(74) *Attorney, Agent, or Firm* — Novick, Kim & Lee, PLLC; Jay Youn Kim

(57) ABSTRACT

Disclosed is a solid state drive tester which reduces the size of the tester and easily changes a function without changing hardware (H/W) by implementing a plurality of devices for testing an SSD as one chip using a Field Programmable Gate Array (FPGA). The solid state drive tester includes: a host terminal receiving a test condition for testing a storage from a user; and a test control unit generating a test pattern corresponding to the test condition, adaptively selecting an interface according to an interface type of the storage to be tested to test the storage using the test pattern, and storing fail data generated during the test in an internal memory. The test control unit is implemented by an FPGA to reduce the size of the tester and easily change a function without hardware.

8 Claims, 4 Drawing Sheets

(56) References Cited

U.S. PATENT DOCUMENTS

| | | | |
|---|---|---|---|
| 2006/0156137 A1* | 7/2006 | Raul et al. | 714/738 |
| 2009/0183045 A1* | 7/2009 | Yao et al. | 714/738 |
| 2013/0007332 A1* | 1/2013 | Teh et al. | 710/313 |
| 2014/0047286 A1* | 2/2014 | Lee et al. | 714/719 |
| 2014/0047287 A1* | 2/2014 | Lee et al. | 714/719 |
| 2014/0047289 A1* | 2/2014 | Lee | 714/719 |

* cited by examiner

SOLID STATE DRIVE TESTER

BACKGROUND OF THE INVENTION

1. Field of the Invention

The present invention relates to a solid state drive (SSD) tester, and more particularly to an SSD tester which reduces the size of the tester and easily changes a function without changing hardware (H/W) by implementing a plurality of devices for testing an SSD as one chip using a Field Programmable Gate Array (FPGA).

2. Description of the Related Art

Until now, hard disk drives (HDDs) have been most generally known and used as large capacity digital media storage devices. However, in recent years, as prices of NAND flash semiconductor devices, which can store the largest capacity among semiconductor devices having a memory function and data stored therein are not erased even when electric power is not supplied, are being lowered, large capacity digital medial storage apparatus such as solid state drives (SSDs) using a semiconductor having a memory function are newly appearing.

Writing and reading speeds of such an SSD are 3 to 5 times as fast as those of existing hard disks, and its performance of reading/writing an random address required by a database management system is several hundreds of times as excellent as those of existing hard disks. In addition, an SSD is operated in a silent way, so a noise problem of an existing hard disk can be solved. Further, since the SSD is operated with power consumption significantly lower than that of a hard disk, the SSD is known as to most suitable for a digital device, such as a laptop computer, which requires low power consumption.

In addition, the SSD has a higher durability against an external impact than an existing hard disk, and as the SSD can be manufactured to be smaller and more various in shape as compared with a hard disk having a fixed form in terms of an external design, an external shape of an electronic product employing the SSD can be made smaller, showing many excellent advantages in its applications.

Due to its advantages, it is expected that distributions of SSDs can be expanded rapidly to searches, home shopping, storage media of video service servers, storage media for storing various R&D materials, and special equipment, as well as existing desktop computers or laptop computers.

As a scheme of testing the above-described SSD, an SSD tester according to the related art is illustrated in FIG. 1.

The SSD tester according to the related art shown in FIG. 1 includes a host terminal 10, a network 20, a communication interface unit 30, a memory 40, a micro processor 50, a storage interface unit 60, and a storage unit 70. The storage interface unit 60 includes a plurality of storage interfaces 61~60+n. The storage unit 70 includes a plurality of storages 71~70+N, and respective storage interfaces perform the same function. In the above described SSD tester according to the related art, each unit is provided as a separate device.

The network 20 maintains a wired/wireless network connection with the host terminal 10. The network 20 may be network-connected to the host terminal 10 through wired communication such as LAN, USB, or RS-232, and wireless local area communication such as Bluetooth, Zigbee, or UWB.

A user inputs a test condition through the host terminal 10, and the input test condition is received through the network and is transferred to the micro processor 50 through the communication interface unit 30 of a next stage.

The micro processor 50 generates a test pattern for testing the storage associated with the memory 40 according to the transferred test condition. The test pattern may be implemented by various test patterns which are widely used for testing an SSD and various storages.

The micro processor 50 controls test of the storage 70 using the generated test pattern. For example, the micro processor 50 generates a test signal based on the test pattern and transmits the test signal to the storage 70 through the storage interface unit 60 so that test of the storage 70 may be controlled.

The storage interface unit 60 maintains interface with the storage 70. The storage interface unit 60 performs Serial-ATA (SATA) with the storage 70.

However, in the related art as illustrated above, since a communication interface, a micro processor, a memory, and an SATA interface being a technical configuration for testing an SSD are connected and operated as separate devices, the size of a board is increased, power consumption is high, and heat is generated.

Particularly, in a case where the SSD tester is implemented by a plurality of separate devices, to test a storage of another interface other than an SATA interface when testing the storage, a previously developed board cannot be used but a board using another interface (for example, PCIe, SAS) must be newly developed.

SUMMARY OF THE INVENTION

Accordingly, the present invention has been made keeping in mind the above problems occurring in the prior art, and an object of the present invention is to provide an SSD tester which reduces the size of the tester by implementing a plurality of devices for testing an SSD as one chip using an FPGA.

It is another object of the present invention to provide an SSD tester which easily changes a function without changing H/W upon addition of a new function by implementing a plurality of devices for testing an SSD by one chip using an FPGA.

It is still another object of the present invention to provide an SSD tester which minimizes power consumption and heat generation by implementing a plurality of devices for testing an SSD as one chip using an FPGA.

According to an aspect of the present invention, there is provided a solid state drive tester including: a host terminal receiving a test condition for testing a storage input from a user; and a test control unit generating a test pattern corresponding to the test condition, adaptively selecting an interface according to an interface type of the storage to be tested to test the storage using the test pattern, and storing fail data in a memory generated during the test.

The test control unit may be implemented as one chip through a Field Programmable Gate Array (FPGA) by using a device interfacing user information, a device interfacing the storage, a device generating the test pattern to control the test, a device processing the fail data generated during the test, and a device separately storing the fail data.

The test control unit may include a communication interface unit connected with the host terminal through the network for receiving information of the user to transmit a test result to the host terminal.

The test control unit may include: a storage interface unit for interfacing the storage; and an embedded processor for generating the test pattern corresponding to the test condition input by the user, controlling selection of an interface by the storage interface unit according to an interface type of a storage to be tested, controlling a test of the storage through the storage interface unit based on the test pattern, and receiving the result.

The test control unit may include: a vector memory for storing expectation data corresponding to the test pattern created by the embedded processor; and a fail processor for comparing the expectation data stored in the vector memory with the test result data acquired from the embedded processor to determine a fail state, and processing fail information generated upon the fail.

The test control unit may include a fail memory for storing the fail information generated from the fail processor.

The fail processor may include: a comparator comparing the expectation data stored in the vector memory with the test result data acquired from the embedded processor and generating a fail signal when the expectation data differs from the test result data; a fail counter counting the number of the fail signals generated from the comparator and outputting a fail count value; and a fail memory address generator generating a storage address for storing the fail signal when the comparator generates the fail signal.

The storage interface unit may include a plurality of multi-interfaces to simultaneously test the storages.

The multi-interfaces may include a plurality of interfaces corresponding to the interface of the storage, and interface with the storage by selecting one of the interfaces according to the interface selection signal from the embedded processor corresponding to the storage.

The multi-interface may include: an advanced host controller interface (AHCI) for interfacing instruction data generated in the embedded processor; a direct memory access unit for interfacing writing data generated in the embedded processor; a serial-ATA (SATA) interface for supporting an SATA interface between the advanced host controller interface and the storage and between the direct memory access unit and the storage; a serial attached SCSI (SAS) interface for supporting an SAS interface between the advanced host controller interface and the storage and between the direct memory access unit and the storage; a PCI express (PCIe) interface for supporting a PCIe interface between the advanced host controller interface and the storage and between the direct memory access unit and the storage; and a multiplexer (MUX) for connecting the storage and the embedded processor by selecting one of the SATA interface, the SAS interface, and the PCIe interface according to an interface selection signal generated from the embedded processor.

According to the present invention, the size of the tester can be reduced by implementing a plurality of device for testing an SSD as one chip using an FPGA.

According to the present invention, a function can be easily changed without changing H/W upon addition of a new function by implementing a plurality of device for testing an SSD as one chip using an FPGA.

According to the present invention, power consumption and heat generation can be minimized by implementing a plurality of device for testing an SSD as one chip using an FPGA.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinafter, an exemplary embodiment of the present invention will be described in detail with reference to the accompanying drawings. A detailed description of known functions and configurations related to the present invention will be omitted when it may make the subject of the present invention unclear.

Figure 1:
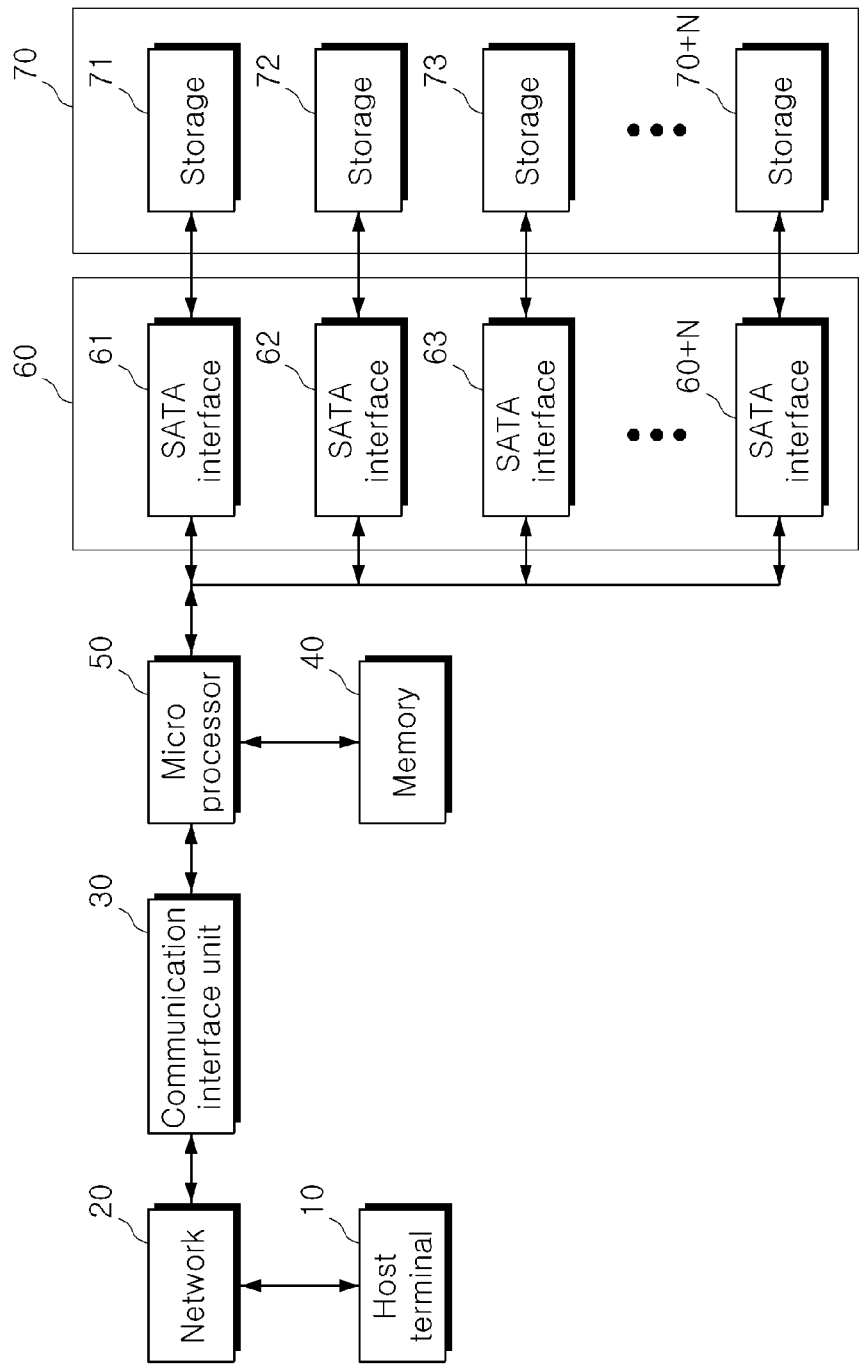
FIG. 1 is a schematic block diagram of a solid state drive test device according to the related art.
Figure 2:
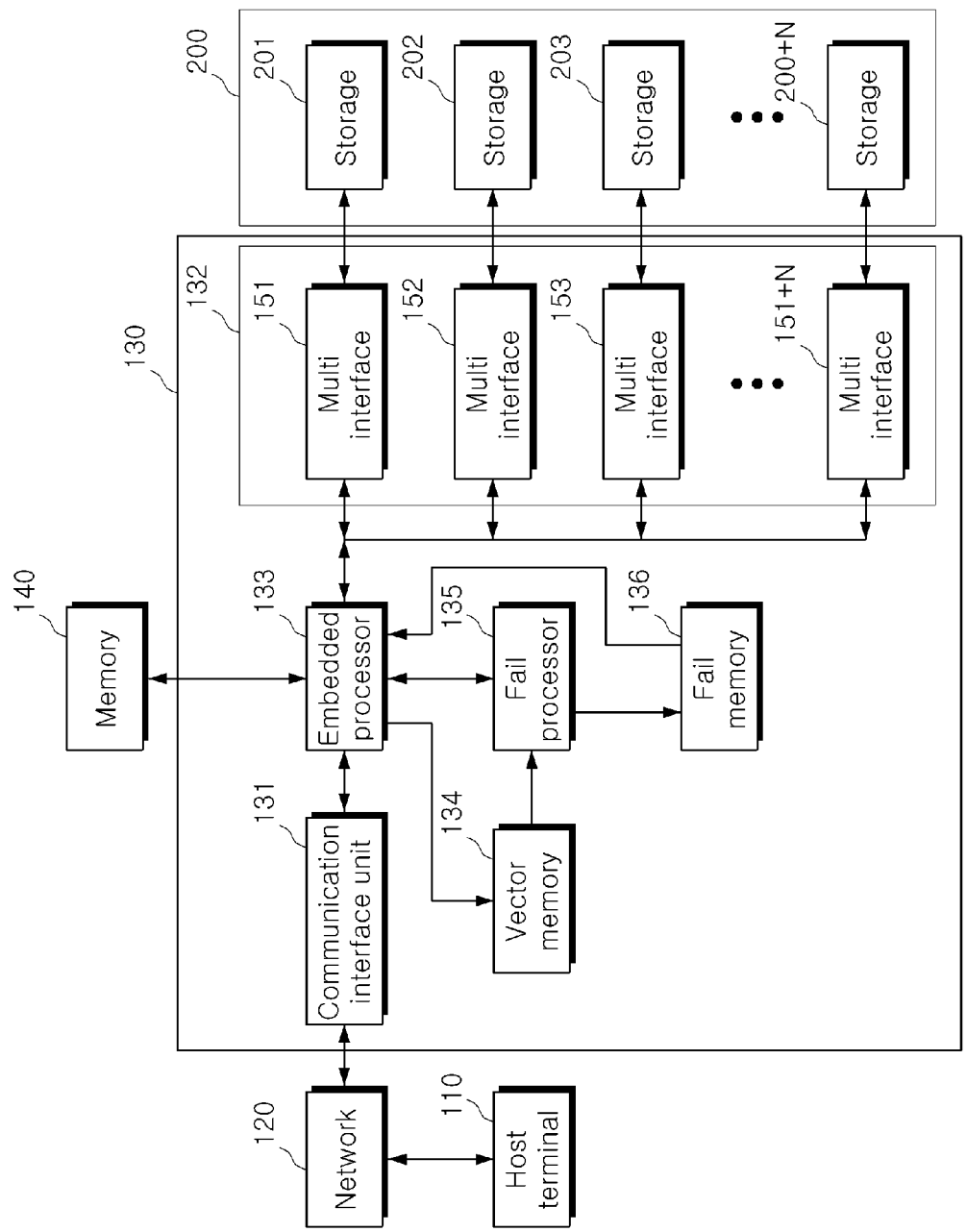
FIG. 2 is a block diagram illustrating a configuration of an SSD tester according to an embodiment of the present invention.

FIG. 2 is a block diagram illustrating a configuration of an SSD tester according to an embodiment of the present invention. The storage interface apparatus includes a host terminal 110, a network 120, a test control unit 130, and a memory 140. In FIG. 2, reference numeral 200 denotes a storage unit 200 including a plurality of storages 201 to 200+N which are test targets.

The host terminal 110 functions to receive a test condition for testing a storage from the user, and the network 120 is in charge of a data interface between the host terminal 110 and the test control unit 130.

A program for testing an SSD is stored in the memory 140, and the memory 140 functions to store pattern data for generating a desired test pattern and data generated during the SSD test.

The test control unit 130 functions to generate a test pattern corresponding to the test condition input by the user, to adaptively select an interface according to an interface type of a storage to be tested to test the storage unit using the test pattern, and to store fail data generated during the test in an internal memory.

Preferably, a plurality of devices installed in the test control unit 130 to test the SSD is implemented as one chip by using a field programmable gate array (FPGA).

The test control unit 130 includes a communication interface unit 131 connected to the host terminal 110 through the network 120 to receive information of the user and to transmit the test result to the host terminal 110, a storage interface unit 132 for interfacing the storage unit 200, and an embedded processor 133 for generating a test pattern corresponding to the test condition input by the user, controlling selection of an interface by the storage interface unit 132 according to an interface type of a storage to be tested, controlling a test of the storage unit 200 through the storage interface unit 132 based on the test pattern, and receiving the result.

Preferably, the test control unit 130 includes a vector memory 134 for storing expectation data corresponding to the test pattern created by the embedded processor 133, a fail processor 135 for comparing the expectation data stored in the vector memory 134 with the test result data acquired from the embedded processor 133 to determine a fail, and processing fail information generating upon a fail, and a fail memory 136 for storing the fail information generated in the fail processor 135.

Figure 3:
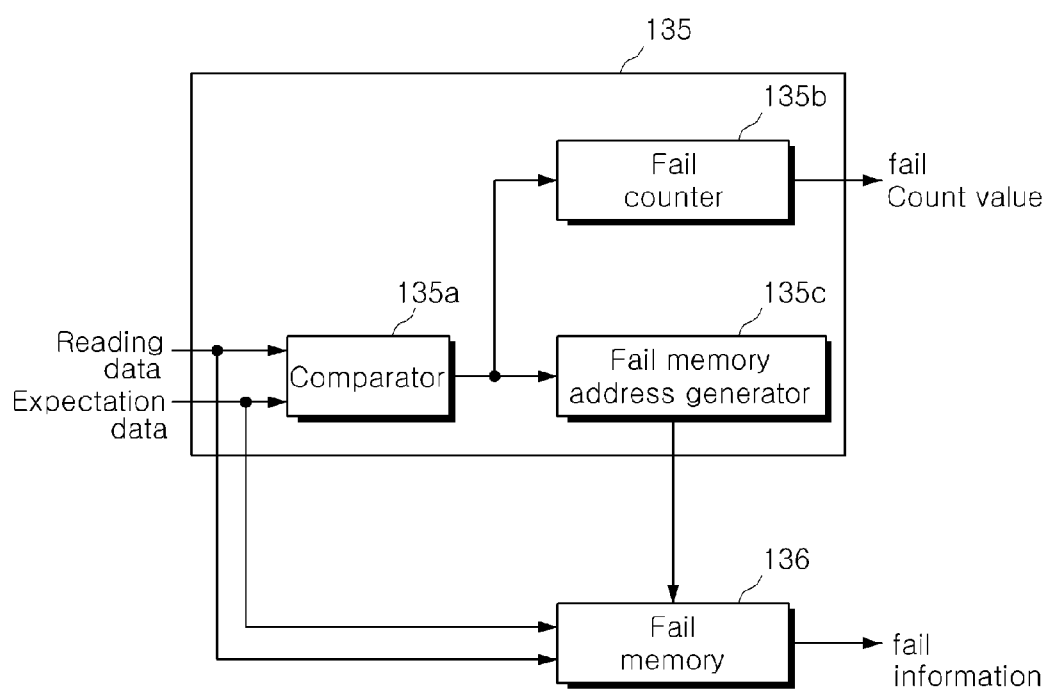
FIG. 3 is a block diagram illustrating an example of a fail processor shown in FIG. 2.

More preferably, as shown in FIG. 3, the fail processor 135 includes a comparator 135a comparing the expectation data stored in the vector memory 134 with the test result data acquired from the embedded processor 133 and generating a fail signal when the expectation data differs from the test result data; a fail counter 135b counting the number of the fail signals generated from the comparator 135a and outputting a fail count value; and a fail memory address generator 135c generating a storage address for storing the fail signal when the comparator 135a generates the fail signal.

Meanwhile, the storage interface unit 132 includes a plurality of multi-interfaces 151 to 151+N to simultaneously test a plurality of the storages.

Here, internal configurations and operations of the plurality of multi-interfaces 151 to 151+N are the same, and thus only one multi-interface 151 will be described below for convenience' sake.

Figure 4:
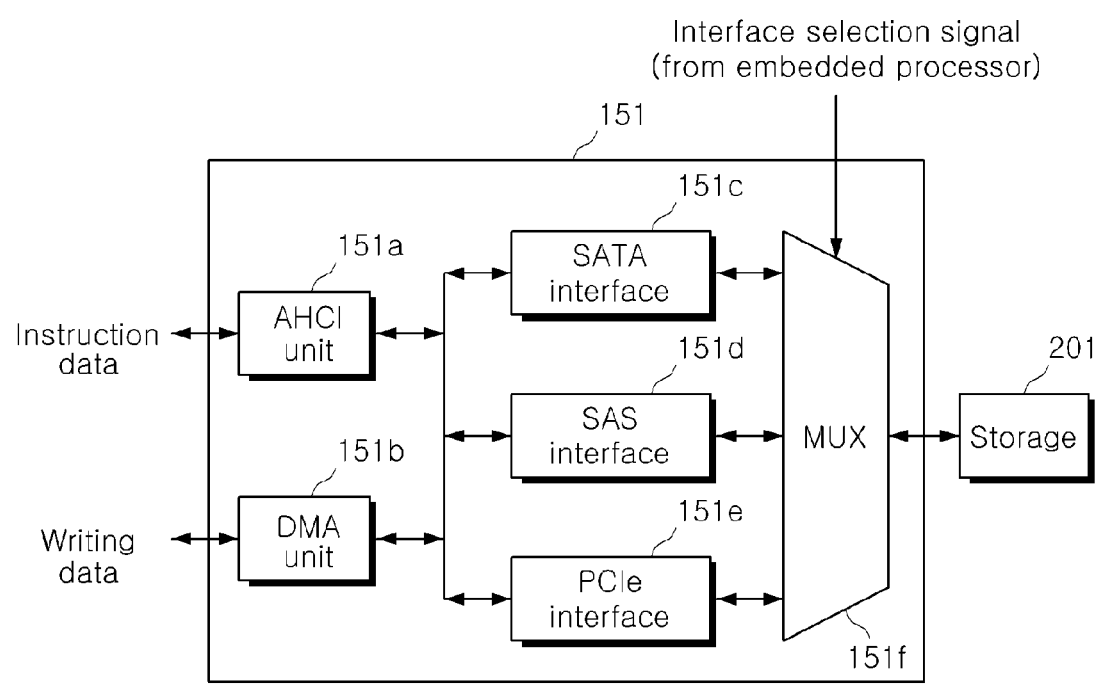
FIG. 4 is a block diagram illustrating an example of a storage interface unit shown in FIG. 2.

As illustrated in FIG. 4, the multi-interface 151 includes an advanced host controller interface (AHCI) 151a for interfacing instruction data generated in the embedded processor 133, a direct memory access (DMA) unit 151b for interfacing writing data generated in the embedded processor 133, a serial-ATA (SATA) interface 151c for supporting an SATA interface between the advanced host controller interface 151a and the storage 201 and between the direct memory access unit 151b and the storage 201, a serial attached SCSI (SAS) interface 151d for supporting an SAS interface between the advanced host controller interface 151a and the storage 201 and between the direct memory access unit 151b and the storage 201, a PCI express (PCIe) interface 151e for supporting a PCIe interface between the advanced host controller interface 151a and the storage 201 and between the direct memory access unit 151b and the storage 201, and a multiplexer (MUX) 151f for connecting the storage 201 and the embedded processor 133 by selecting one of the SATA interface 151c, the SAS interface 151d, and the PCIe interface 151e according to an interface selection signal generated in the embedded processor 133.

In the storage interface apparatus for a solid state drive tester according to the present invention, a plurality of test devices for testing a storage are implemented as one chip on one board by using FPGA, thereby reducing an entire size of the solid state drive tester and minimizing power consumption, solving heat generation problem when diving a plurality of device as one chip.

In more detail, after a user for testing an SSD connects a solid state drive tester to the storage 201 to be tested, the user inputs a test condition through the host terminal 110. Here, the test condition may contain an interface selection signal for an interface with a storage to be tested.

The test condition of the user input through the host terminal 110 is transferred to the one-chipped test control unit 130 through the network 120.

The communication interface unit 131 of the test control unit 130 receives the test condition input by the user through the network 120, and transfers the received test condition to the embedded processor 133. If the test condition is input by the user and a test is requested, the embedded processor 133 extracts a test program for the storage test from a memory 140 and starts to test the storage. Here, as an initial operation of the test, test pattern data corresponding to the test condition input by the user are extracted to the memory 140 to create a test pattern.

The generated test pattern is input to the vector memory 134 as expectation data and is transferred to the multi-interface 151 at the same time, and then an interface selection signal is provided to the multi-interface 151 to select an interface corresponding to the storage 201.

For example, an interface selection signal is applied from the embedded processor 133 to the multiplexer 151f of the multi-interface 151, the multiplexer 151f selects one of the interfaces SATA, SAS, and PCIe according to the applied interface selection signal. That is, an interface corresponding to the interface of the storage 201 is selected.

Thereafter, instruction data output from the embedded processor 133 for the test are input to the SATA interface 151c, the SAS interface 151d, and the PCIe interface 151e through the advanced host controller interface 151a, respectively.

In addition, writing data output from the embedded processor 133 are input to the SATA interface 151c, the SAS interface 151d, and the PCIe interface 151e, respectively, through the DMA unit 151b.

In a state where the instruction data and the writing data output from the embedded processor 133 are input to the respective interfaces in this way, the multiplexer 151f selects only one interface according to an interface selection signal. The test of the storage 201 is started by transferring the instruction data and writing data input to the selected interface to the storage 201. For example, when the interface of the storage 201 uses the SATA interface, the SATA interface 151c is selected, and the instruction data and writing data input to the SATA interface 151c are converted into a format suitable for the SATA interface to be applied to the storage 201.

Here, since standard interfaces are employed for the SATA interface, the SAS interface, and the PCIe interface, and protocols for interfaces, a detailed description of respective interfaces is omitted.

Next, after result data for testing the storage 201 are read out according to a reading instruction, they are transferred to the embedded processor 133 through the multiplexer 151f, the SATA interface 151c, and the DMA unit 151b of the multi-interface 151.

If the data obtained by reading out the storage test are transferred to the embedded processor 133, the embedded processor 133 transmits the readout data to the fail processor 135.

As shown in FIG. 3, a comparator 135a of the fail processor 135 compares expectation data read out from the vector memory 134 with the readout data (reading data) transferred from the embedded processor 133, and does not generate a fail signal if they are the same and generates a fail signal if they are different.

According to the generated fail signal, the fail counter 135b increases an internal count value by 1 to output a fail count value, and a fail memory address generator 135c generates and transfers an address of a fail memory 136 to the fail memory 136.

The fail memory 136 stores expectation data and reading data inputted to the fail processor 135 as fail information by using the transferred address as a Logical Block Address (LBA).

As described above, in another characteristic of the present invention, since the embedded processor 133 does not perform fail processing during testing a storage but a fail processing means separated from the embedded processor 133 performs fail processing, burden of the embedded processor 133 can be reduced and accordingly a storage test time can be reduced.

Further, the fail information stored in the fail memory 136 is transferred to the embedded processor 133 upon the request of the embedded processor 133, and is transmitted to the host terminal 110 through the communication interface unit 131 and the network 120.

Thus, the user can easily recognize the test result of the storage tested through the host terminal 110.

As mentioned above, the present invention can implements a plurality of devices such as a communication interface, an embedded processor, and a storage interface as one chip using an FPGA to reduce the board size of the tester and to minimize power consumption. The present invention can minimize heat generation to solve heat generation problem of the related art by minimizing the heat generation as compared with a case of using a plurality of devices by using one board.

The present invention designs interface of a storage using an FPGA which allows a user to easily use the interface if needed. Various interfaces are implemented as one chip using an FPGA which allows the user to selectively use interface corresponding to the interface of the storage without changing H/W.

The present invention is not limited to the above-described embodiment, and may be variously modified by those skilled in the art to which the present invention pertains without departing from the spirit of the present invention and the modification falls within the scope of the present invention.

What is claimed is:

1. A solid state drive tester comprising:
   a host terminal receiving a test condition for testing a storage from a user; and
   a test control unit generating a test pattern corresponding to the test condition, adaptively selecting an interface according to an interface type of the storage to be tested to test the storage using the test pattern, and storing fail data generated during the test in an internal memory,
   wherein the test control unit includes:
   an embedded processor for generating the test pattern corresponding to the test condition input by the user;
   a vector memory for storing expectation data corresponding to the test pattern created by the embedded processor; and
   a fail processor for comparing expectation data stored in the vector memory with test result data acquired from the embedded processor to determine a fail state, and processing fail information generated upon failure, and
   wherein the fail processor includes:
   a comparator comparing the expectation data stored in the vector memory with the test result data acquired from the embedded processor and generating a fail signal when the expectation data differs from the test result data;
   a fail counter counting the number of fail signals generated from the comparator and outputting a fail count value; and
   a fail memory address generator generating a storage address for storing the fail signal when the comparator generates the fail signal.

2. The solid state drive tester of claim 1, wherein the test control unit is implemented as one chip through a Field Programmable Gate Array (FPGA) by using a device interfacing user information, a device interfacing the storage, a device generating the test pattern to control the test, a device processing the fail data generated during the test, and a device separately storing the fail data.

3. The solid state drive tester of claim 1, wherein the test control unit comprises a communication interface unit connected with the host terminal through a network to receive information of the user and to transmit a test result to the host terminal.

4. The solid state drive tester of claim 3, wherein the test control unit comprises a storage interface unit for interfacing the storage; and
   wherein the embedded processor is configured for controlling selection of the interface by the storage interface unit according to the interface type of the storage to be tested, controlling a test of the storage through the storage interface unit based on the test pattern, and receiving the result.

5. The solid state drive tester of claim 4, wherein the storage interface unit includes a plurality of multi-interfaces to simultaneously test a plurality of storages.

6. The solid state drive tester of claim 5, wherein one of the multi-interfaces is selected according to an interface selection signal generated from the embedded processor so as to interface with one of the plurality of storages.

7. The solid state drive tester of claim 6, wherein the multi-interface comprises:
   an advanced host controller interface (AHCI) for interfacing instruction data generated in the embedded processor;
   a direct memory access unit for interfacing writing data generated in the embedded processor;
   a serial-ATA (SATA) interface for supporting an SATA interface between the advanced host controller interface and the storage and between the direct memory access unit and the storage;
   a serial attached SCSI (SAS) interface for supporting an SAS interface between the advanced host controller interface and the storage and between the direct memory access unit and the storage;
   a PCI express (PCIe) interface for supporting a PCIe interface between the advanced host controller interface and the storage and between the direct memory access unit and the storage; and
   a multiplexer (MUX) for connecting the storage and the embedded processor by selecting one of the SATA interface, the SAS interface, and the PCIe interface according to an interface selection signal generated from the embedded processor.

8. The solid state drive tester of claim 1, wherein the test control unit comprises a fail memory for storing the fail information generated from the fail processor.

* * * * *